United States Patent [19]
Samukawa et al.

[11] Patent Number: 6,043,608
[45] Date of Patent: Mar. 28, 2000

[54] PLASMA PROCESSING APPARATUS

[75] Inventors: Seiji Samukawa; Yukito Nakagawa; Hisaaki Sato; Tsutomu Tsukada, all of Tokyo; Kibatsu Shinohara; Yasuo Niimura, both of Kanagawa, all of Japan

[73] Assignees: NEC Corporation, Tokyo; Anelva Corporation, Fuchu; Nihon Koshuha Co., Ltd., Yokahamo, all of Japan

[21] Appl. No.: 08/962,390

[22] Filed: Oct. 31, 1997

[30]        Foreign Application Priority Data

Oct. 31, 1996   [JP]   Japan ...................................... 8-307208

[51] Int. Cl.$^7$ .................................................. H05B 37/00
[52] U.S. Cl. ................................ 315/111.51; 315/111.21; 315/111.61
[58] Field of Search ............... 343/700 MS; 315/111.51, 315/111.21, 111.31, 111.41, 111.61, 111.71

[56]               References Cited

U.S. PATENT DOCUMENTS

| | | | |
|---|---|---|---|
| 4,792,810 | 12/1988 | Fukuzawa et al. | 343/778 |
| 5,565,736 | 10/1996 | Samukawa et al. | 315/111.51 |
| 5,580,385 | 12/1996 | Paranjpe et al. | 118/723 I |
| 5,800,621 | 9/1998 | Redeker et al. | 118/723 AN |

OTHER PUBLICATIONS

"New Ultra–High Frequence Plasma Source For Large–S-cale Etching Processes", Seiji Samukawa et al., Jpn. J. Appl. Phys. vol. 34 Part 1 No. 12B (Dec. 1995) pp. 6805–6808.

*Primary Examiner*—Don Wong
*Assistant Examiner*—James Clinger
*Attorney, Agent, or Firm*—Armstrong, Westerman, Hattori, McLeland and Naughton

[57]               ABSTRACT

This invention discloses a plasma processing apparatus for carrying out a process onto a substrate utilizing a plasma generated by supplying RF energy with a plasma generation gas. This apparatus comprises a vacuum chamber having a pumping system, a substrate holder for placing the substrate to be processed in the vacuum chamber, a gas introduction means for introducing the plasma generation gas into a plasma generation space, an energy supply means for supplying the RF energy with the plasma generation gas. The antenna has multiple antenna elements provided symmetrically to the center on the axis of the substrate and an end shorting member shorting each end of the antenna elements so that an RF current path symmetrical to the center is applied. Multiple circuits resonant at a frequency of the RF energy are formed symmetrically of the antenna elements and the end shorting member. Length obtained by adding total length of neighboring two of the antenna elements and length of the RF current path between ends of neighboring two of the antenna elements corresponds to one second of wavelength of the RF energy.

9 Claims, 10 Drawing Sheets in case n = 1 in case n = 2

PLASMA PROCESSING APPARATUS

BACKGROUND OF THE INVENTION

1. Field of the Invention

The invention relates to a plasma processing apparatus where a process is carried out utilizing a plasma onto a substrate such as a semiconductor.

2. Description of the Prior Art

Apparatuses where a process is carried out utilizing a plasma onto a substrate such as a semiconductor wafer and a liquid crystal display (LCD) substrate are well-known as plasma chemical vapor deposition (CVD) apparatuses and plasma etching apparatuses. In these apparatuses, it is necessary to generate high-density plasmas to satisfy a demand for higher process speeds. In addition, it is requested to generate a high-density plasma at a lower pressure from a point of view for enhancing micro-patterning precision. Plasma generation at lower pressures needs improvements such as enhancing ionization efficiency. As apparatuses which can generate a plasma at a low pressure, helicon-wave plasma processing apparatuses, electron cyclotron resonance (ECR) plasma processing apparatuses and inductive-coupled plasma processing apparatuses have been developed.

FIG. 12 shows an example of those prior plasma processing apparatuses, which is disclosed in the Japanese laid-opened No.3-79025. The apparatus shown in FIG. 12 is essentially composed by a vacuum chamber 1 having a dielectric window 11 at its upper wall, a substrate holder 2 for placing a substrate in vacuum chamber 1, a gas introduction means 3 for introducing a plasma generation gas into vacuum chamber 1, a radio frequency (RF) coil 40 provided outside vacuum chamber 1 and close to dielectric window 11, and a RF source 42 for supplying RF power with RF coil 40. Vacuum chamber 1 is an air-tight vessel comprising a pumping system 12. The plasma generation gas is introduced into vacuum chamber 1 by gas introduction means 3. Substrate holder 2 is provided at a lower position inside vacuum chamber 1 and holds a substrate 20 on its upper surface. RF coil 40 is formed like a whirl pool, which axis is vertical to substrate 20, at a plane parallel to substrate 20. The RF power supplied with RF coil 40 from RF source 42 applies a RF field through dielectric window 11. By this RF field, a discharge is ignited with the plasma generation gas introduced into vacuum chamber 1, thus generating a plasma. This plasma is called "inductive-coupled plasma" because RF coil 40 and the plasma are inductively coupled through dielectric window 11. High-density plasmas of order of $10^{11} cm^{-3}$, which means $10^{11}$ electrons per one cubic centimeter, at the pressure range of order of $10^{-3}$ Torr can be generated with the apparatus shown FIG. 1. However, this type of apparatus has a problem that high-energy electrons which deteriorate process quality are produced when such a high-density plasma is generated.

Specifically, $SiO_2/Si$ selective etching using a reactive gas such as $C_4F_8$ by a plasma etching method has been studied. This selective etching utilizes a phenomenon where the etching may stop at Si layer because there is no oxygen and carbon polymer film is deposited, contrarily to that the etching does not stop at $SiO_2$ layer because there is oxygen which produces volatile CO, $CO_2$ and $COF_2$ and no carbon polymer film is deposited. Through a study by the inventors, it was turned out that the selectivity of $SiO_2/Si$ may decrease when the energy supplied with the plasma is increased. The reason of this is supposed that the increased energy produces a lot of high-energy electrons, which may excessively dissociate $C_4F_8$ gas. Though the exact mechanism can not be described, it is supposed that the Si layer would be etched because the carbon polymer film is deposited involving fluorine chemical species which are activated by the high-energy electrons, or, the carbon polymer film is deposited under existence of active fluorine or fluoride.

The apparatus shown in FIG. 12 has high probability of production of high-energy electrons which cause the above problem. The reason of this relates to a frequency of the RF energy. The apparatus shown in FIG. 12 uses a frequency of several MHz more than 10 MHz such as 13.56 MHz, and applies an alternating field of this frequency in the plasma generation space. In this case, electrons move through the plasma generation space, changing their directions at every time when the field changes its direction. When some electrons change their moving direction, they follow the field to be sometime accelerated by the field, thus becoming high-energy electrons. To reduce the proportion that electrons follow an alternating field to increase its energy, it is effective to supply RF energy of a frequency of 100 MHz or more. When such a high frequency is used, reversal moving lengths of electrons following the field inversion are shortened. Therefore, the energy increase of electrons is suppressed and the production of high-energy electrons is prevented. However, it is very difficult to excite a RF of 100 MHz or more by a whirl-pool-shaped RF coil shown in FIG. 12.

When a RF of several GHz, i.e., microwave, is used, the RF is coupled by a three dimensional circuit such as a wave guide tube. For example, an ECR plasma processing apparatus uses 2.45 GHz microwave guided by a rectangular wave guide. The production of harmful high-energy electrons, which is demonstrated at several MHz more 10 MHz, is indeed suppressed. On the other hand, it is difficult to generate and maintain a plasma only by RF energy of such a high frequency. In this case, it needs an assistance such as cyclotron resonance by a magnetic field. In fact, ECR plasma processing apparatuses establish the ECR condition applying a high magnetic field of about 1000 gauss its high-density plasma generation However, when a high magnetic field is applied to generate a plasma, there is a problem that a surface process is affected by the magnetic field and loses its uniformity, because electrons are continuously accelerated through mutual reactions of the electric field and the magnetic field. A substrate easily suffers a charging-up damage which pattern corresponds with a magnetic field profile on the substrate surface, resulting from that charged particles are carried along the magnetic lines to the substrate. The charging-up damage is, for example, that breakdown of a insulation film on a substrate surface is caused by a potential difference which corresponds with the magnetic field profile on the substrate surface.

By a study of the inventors, frequency range of 100 MHz to 1000 MHz (1 GHz) can prevent such harmful high-energy electrons from being produced and make it unnecessary to apply such a high magnetic field as in ECR plasma processing apparatuses. However, any practical apparatuses using RF energy of this range have not been developed.

SUMMARY OF THE INVENTION

The object of the invention is to solve those problems described above. Specifically, the object of the invention is to present a practical plasma processing apparatus where a plasma is generated preferably using a RF of 100 MHz to 1000 MHz.

To accomplish this object, this invention presents a plasma processing apparatus comprising an antenna which has multiple antenna elements provided symmetrically to the center of a substrate to be processed and an end shorting member shorting each end of the antenna elements so that an RF current path symmetrical to the center is applied.

PREFERRED MODES OF THE INVENTION

Figure 1:
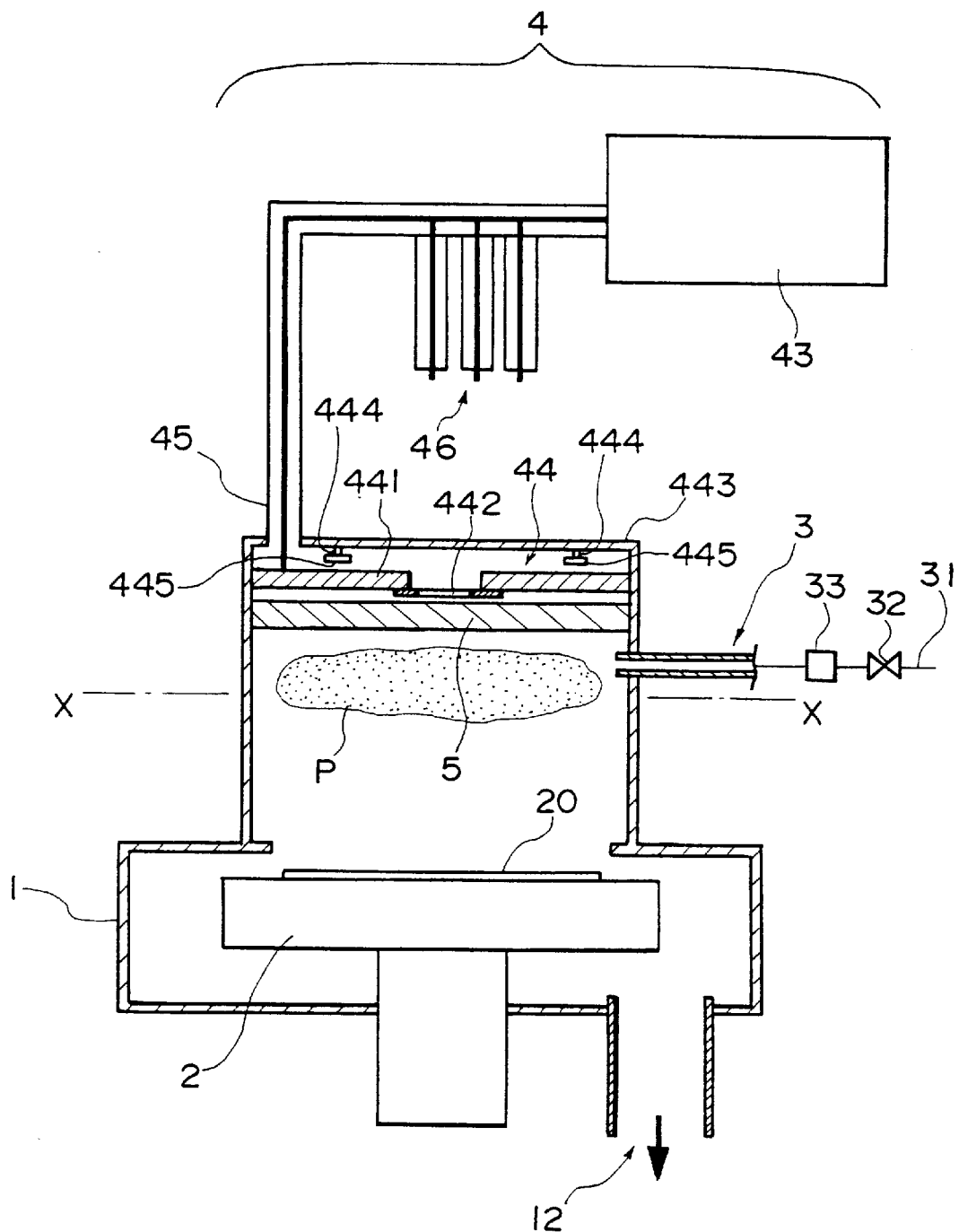
FIG. 1 is a schematic front view of the first mode plasma processing apparatus of the invention.
Figure 2:
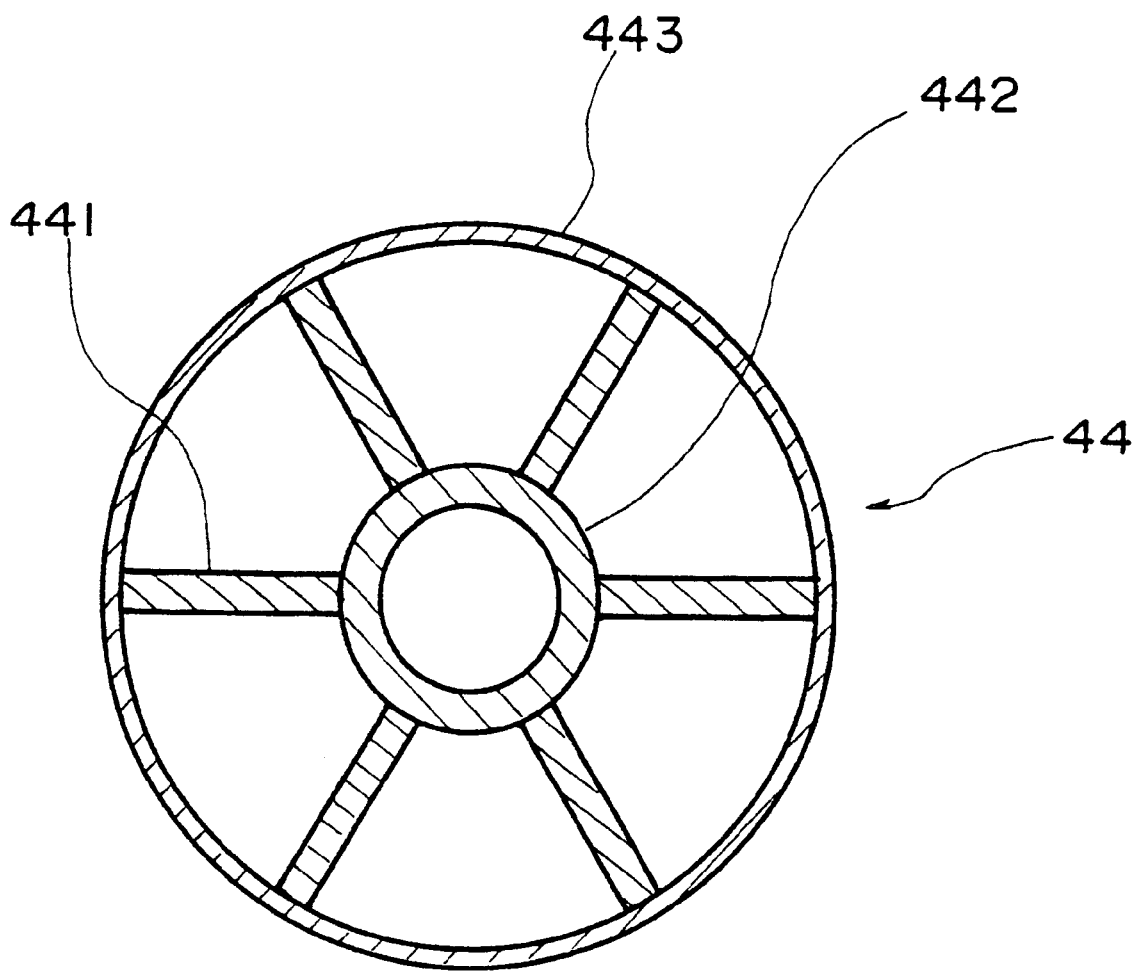
FIG. 2 is a schematic plane view of the antenna in the apparatus of FIG. 1.

Preferred modes of the invention are described as follows. FIG. 1 is a schematic front view of the first mode plasma processing apparatus of the invention. FIG. 2 is a schematic plane view of the antenna in the apparatus of FIG. 1. The plasma processing apparatus shown in FIG. 1 comprises a vacuum chamber 1 having a pumping system 12, a substrate holder 2 for placing a substrate 20 in vacuum chamber 1, a gas introduction means 3 for introducing a plasma generation gas into an upper space of substrate 20, which is the plasma generation space, in vacuum chamber 1, energy supply means 4 for supplying energy with the introduced gas to generate a plasma.

Vacuum chamber 1 is an air-tight vessel comprising a gate valve (not shown) and is kept at the earth potential. Pumping system 12 is a multistage pumping system having multiple vacuum pumps such as a combination of an oil-sealed rotary pump and a turbo-molecular pump. Pumping system 12 can pump vacuum chamber 1 to, for example, 10–6 Torr. Substrate holder 2 comprises an electrostatic chucking mechanism (not shown) for chucking substrate 20 on its upper surface. A temperature controller (not shown) including a heater to heat substrate 20 is provided in substrate holder 2, if necessary. A substrate bias power supply (not shown), which applies a RF voltage with substrate holder 2 to give a bias potential with substrate 20 through a reaction of the RF voltage and a plasma, is connected with substrate holder 2, if necessary.

Gas introduction means 3 comprises a gas introduction pipe 31 interconnecting a gas bomb (not shown) and vacuum chamber 1, and a valve 32 and a gas flow controller 33 provided on gas introduction pipe 31. A kind of gas introduced for plasma generation depends on a kind of process onto substrate 20. For example, if a plasma etching is carried out onto substrate 20, fluoride gas as reactive gas is used to generate a plasma so that active fluorine or fluoride can be produced in the plasma to etch substrate 20. If an amorphous silicon film deposition is carried out onto substrate 20, a gas mixture of silane ($Si_nH_{2n+2}$) and hydrogen ($H_2$) is used to generate a plasma so that silane can be decomposed in the plasma to deposit an amorphous silicon turn into substrate 20.

Energy supply means 4 comprises a RF source 43 which generates RF power, antenna 44 which supplies the RF power generated by RF source 43 with the plasma generation gas in vacuum chamber 1, a RF line 45 which connects RF source 43 and antenna 44, and stub tuner 46 provided on RF line 45. RF source 43 preferably generates RF power which frequency is 100 MHz to 1000 MHz. If that is lower than 100 MHz, it is impossible to suppress the production of harmful high-energy electrons as described. If that is higher than 1000 MHz, it is impossible to generate a high-density plasma without such another means as a magnetic field application. Specifically, in this mode, an RF oscillator which oscillation frequency is 500 MHz of the UHF band and output is 2 kW is used as RF source 43. As RF line 45, a coaxial cable is typically used. Stub tuner 46 is to match the impedance of the downward line so that the RF would not reflect back to RF source 43.

Composition of antenna 44 characterizes the apparatus of this mode. As shown in FIG. 1 and FIG. 2, antenna 44 is composed essentially of multiple antenna elements 441 provided symmetrically to the center on the axis of substrate 20, end shorting member 442 which applies a symmetric RF current path by shorting inner ends of each antenna element 441 and cylindrical antenna holder 443 which holds outer ends of each antenna element 441. Antenna elements 441 are all, as shown in FIG. 1 and FIG. 2, round bars with the same length. Antenna elements 441 are provided along radiate lines symmetric to the center on the axial of substrate 20. Each inner end of antenna elements 441 is displaced from the center with the same distance. All antenna elements are provided on the same plane, which is parallel to substrate 20. This plane is hereafter called "antenna plane". In this mode, six antenna elements 441 are provided 60 degrees apart from each other. The length of each antenna element 441 is 120 mm. The cross-section diameter of each antenna element 441 is 15 mm. End shorting member 442 is, in this mode, a ring connecting each inner end of antenna elements 441. This ring is formed by making a circle with a metal belt of 10 mm in width and 1 mm in thickness. The inner diameter of this ring is 100 mm. End shorting member 442 is held by antenna elements 441. Specifically, the upper surface of end shorting member 442 is jointed with the down surfaces of each antenna element 441. Antenna holder 443 is a cylinder which upper side is a wall and down side is an opening. Each outer end of antenna elements 441 is fixed at the inner surface of antenna holder 443. Antenna holder 443 is 350 mm in inner diameter and 360 mm in outer diameter. As shown in FIG. 1, the upper wall of vacuum chamber 1 has a circular opening which diameter is a little smaller than antenna holder 443. Antenna holder 443 is connected airtightly with the upper wall of vacuum chamber 1 so as to cover this circular opening. Antenna holder 443 is an airtight vessel having a seal where a member such as RF line 45 penetrates so that the vacuum atmosphere can be maintained together with vacuum chamber 1. Each antenna element 441, end shorting member 442 and antenna holder 443 are all made of a metal or alloy such as aluminum or copper. They are jointed by welding, soldering, brazing or screwing.

In the composition of this mode, RF line 45 is connected with one of antenna elements 441. Therefore, the RF is initially supplied with this antenna element 441. Each antenna element 441 is placed so that two antenna elements 441 neighboring each other can be coupled by the RF. Therefore, the RF supplied to one antenna element 441 propagates to neighboring antenna elements 441, resulting in that the RF is radiated from each antenna element 441 uniformly. The earth line of the coaxial cable used as RF line 45 is connected with antenna holder 443.

Neighboring two antenna elements 441 and the RF current path at end shorting member 442 compose a resonance circuit at the frequency of the supplied RF. Specifically, the composition where neighboring two antenna elements 441 and the RF current path at end shorting member 442 compose a resonance circuit corresponds to a resonance in a RF circuit with the shorted receiving end. The RF resonance condition in the shorted receiving end is, as known;

$$l = n\lambda/2 \qquad (1)$$

where 1 is length of the line, n is 1,2 . . . , $\lambda$ is wavelength of RF.

Figure 3A:
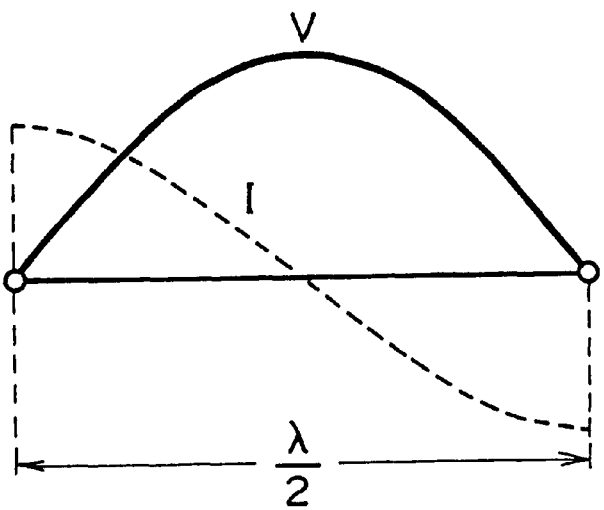
FIG. 3 schematically explains the resonant condition in the apparatus of FIG. 1.
Figure 3B:
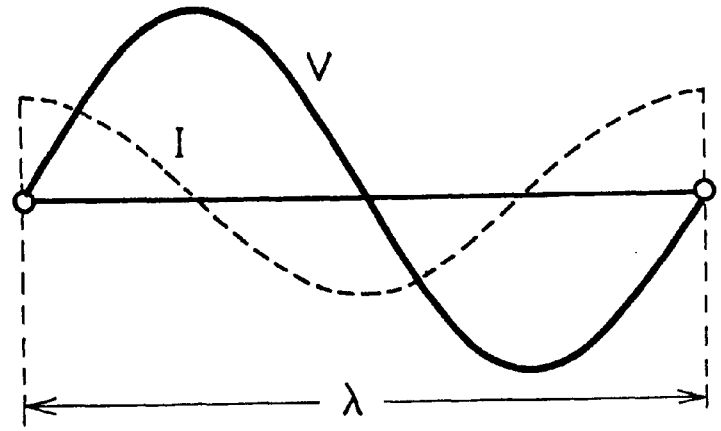

FIG. 3 explains this resonance condition. FIG. 3(A) is in case n=1 and FIG. 3(B) is in case n=2 respectively at formula (1). Explaining the resonance condition in case n=1 as an example, from $\lambda=c/f$ (c is the light velocity in vacuum), formula (1) can be modified to;

$$l = n \; c/2f \qquad (2)$$

Letting n=1, f=500×10$^6$ (Hz) and c=2.99792458×10$^8$ (m/s) in formula (2), $$l \approx 0.29(m)$$

is obtained.

On the other hand, calculating the length of the line in this mode from described dimensions of antenna elements 441 and end shorting member 442, the length of the line is about 292 mm, because the length of the line={(the length of antenna element 441)×2+(the circumference length of end shorting member 442)/6}. This value of the length is almost equal to the described 1($\approx$0.29(m)). That is, with the dimensions in this mode, the supplied-RF resonates in the state of FIG. 3(A). As understood from FIG. 3(A), the voltage gets maximum and the current gets minimum at the center of the line, i.e., at end shorting member 442, and the voltage gets minimum and the current gets maximum at the joint of antenna element 441 and earthed antenna holder 443.

Though the resonance condition calculated above is under assuming that inductive reactance L and capacitive reactance C are the same as those at the free space, the inventors confirmed the supplied RF resonates sufficiently. Yet, strictly speaking, when the total length of the line formed of two antenna elements 441 and end shorting member 442 corresponds to one half of the RF wavelength at the line itself, the supplied RF resonates most. In other words, one half of the RF wavelength is meant not at the free space but at the line having a certain inductive reactance and capacitive reactance, which are intrinsic to antenna elements 441 and end shorting member 442.

The capacitve reactance of the line can be coordinated by such a structure as shown in FIG. 1. Specifically, holder rods 444 made of conductor are provided at the upper wall of antenna holder 443. Holder rods 444 are movable up and down. Metal blade 445 is fixed at the lower end of each holder rod 444. When a holder rod 444 moves up and down, the distance between a metal blade 445 and an antenna element 441 is changed. By changing distances between metal blades 445 and antenna elements 441, the capacitive reactance of the line can be coordinated. In a practical design, the length of antenna element 441 and the size of end shorting member 442 often have to be decided according to a parameter such as a size of substrate to be processed. In this case, by coordinating the capacitive reactance as described, "one half of the RF wavelength" can be made correspondent to "the length of the line formed of two antenna elements and the end shorting member".

Figure 4:
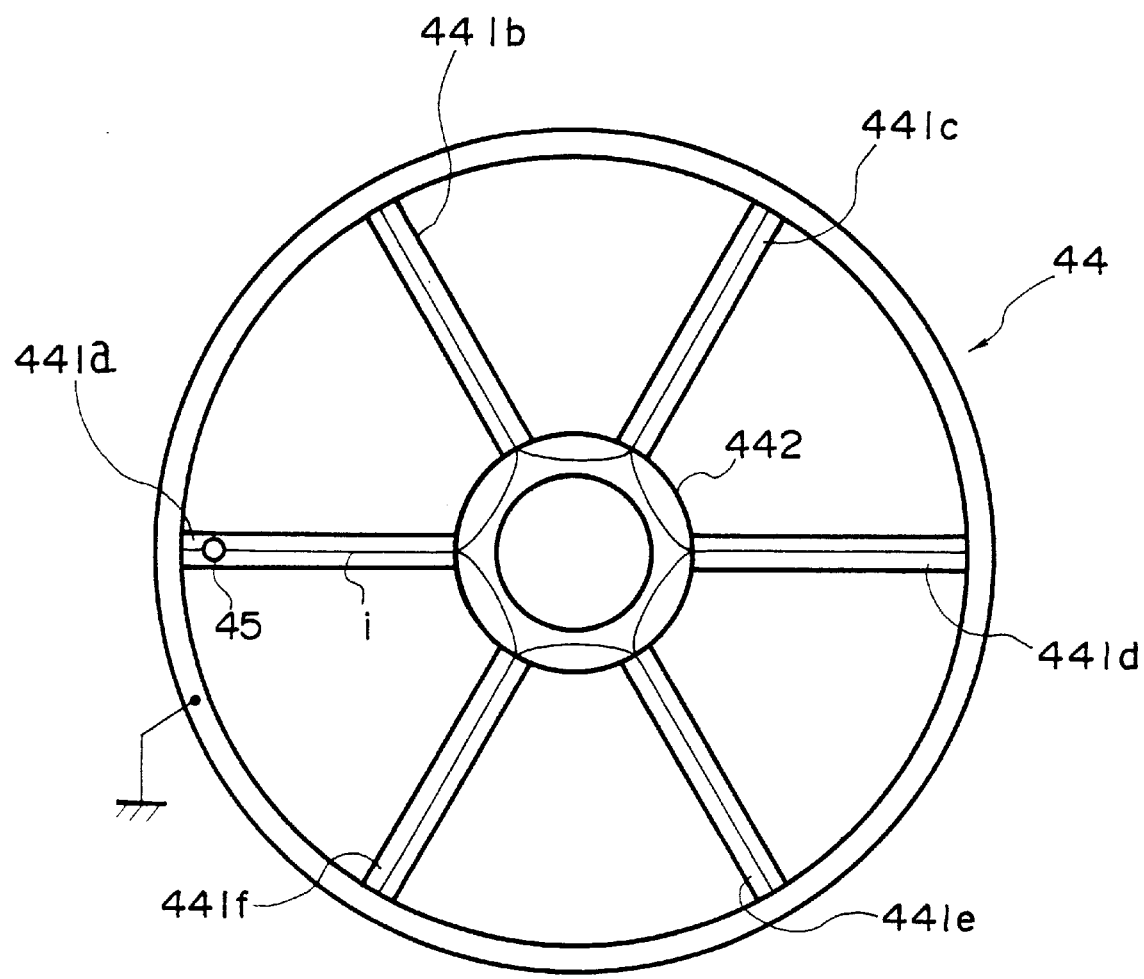
FIG. 4 schematically explains the operation of the antenna in the apparatus shown in FIG. 1.

Operation of antenna 44 will be described as follows. FIG. 4 schematically explains the operation of antenna 44. Described six antenna elements 441 are hereafter called clockwise first antenna element 441a, second antenna element 441b, third antenna element 441c, fourth antenna element 441d, fifth antenna element 441e and sixth antenna element 441f Following description is in case RF line 45 in connected with first antenna element 441a. So, the RF power is initially supplied antenna element 441a. An antenna element 441 with which RF line is connected to be excited initially is hereafter called "initially-excited antenna element".

When the RF power is supplied with first antenna element 441a, a RF current "i" flows from first antenna element 441a to neighboring second antenna element 441b and sixth antenna element 441f via end shorting member 442. At this time, a resonance circuit is formed of first antenna element 441a and second antenna element 441b, and, another resonance circuit is formed of first antenna element 441a and sixth antenna element 441f. In other words, three antenna elements 441a, 441b, 441f are resonantly excited. Subsequently, a RF current "i" flows at third antenna element 441c through RF coupling with second antenna element 441b, and another RF current "i" flows fifth antenna element 441e through RF coupling with sixth antenna element 441f. Specifically, the RF current "i" flowing at second antenna element 441b induces a magnetic field which generates an RF current "i" flowing at third antenna element 441c, and the RF current 1 flowing at sixth antenna element 441b induces another magnetic field which generates another RF current "i" flowing at fifth antenna element 441c. As a result, a resonance circuit is formed of second antenna element 441b and third antenna element 441c, and another resonance circuit is formed of sixth antenna elements 441f and fifth antenna element 441e. Therefore, these antenna element 441b, 441c, 441e, 441f are resonantly excited. Subsequently, an RF current "i" flows at fourth antenna element 441d through RF couplings with third antenna element 441c and with fifth antenna element 441e. As a result, a resonance circuit is formed of third antenna element 441c and fourth antenna element 441d, and another resonance circuit is formed of fifth antenna element 441e and fourth antenna element 441d. As understood from the above description, the RF supplied initially with first antenna element 441a propagates circumferentially through antenna elements 441 with forming resonance circuits at every neighboring two antenna elements 441, resulting in that antenna 44 is excited uniformly as a whole.

There is a great advantage to simplify RF transmission system in the described composition where RF line 45 is connected with only one of antenna elements 441 so that supply the RF can be initially supplied to only one of antenna elements 441. The RF line may be connected with two or more antenna elements 441, for example two antenna elements 441 which are 180 degrees apart from each other, so that the RF can be supplied with two or more antenna elements 441 at the same time. However, this structure needs a RF divider for dividing the RF line to two or more sub-lines, which makes the transmission system complicated. Moreover, to divide RF power to sub-lines uniformly enough is technically difficult. Sometimes antenna 44 is not excited uniformly because the RF supplied with antenna elements 441 gets out of balance. Contrarily, the apparatus of this mode does not need to supply two or more antenna elements 441 initially because the RF couplings between every two antenna elements 441 are reinforced by end shorting member 442. Therefore, the RF transmission system can be simplified and excitation of whole antenna 44 does not get out of balance.

Figure 5:
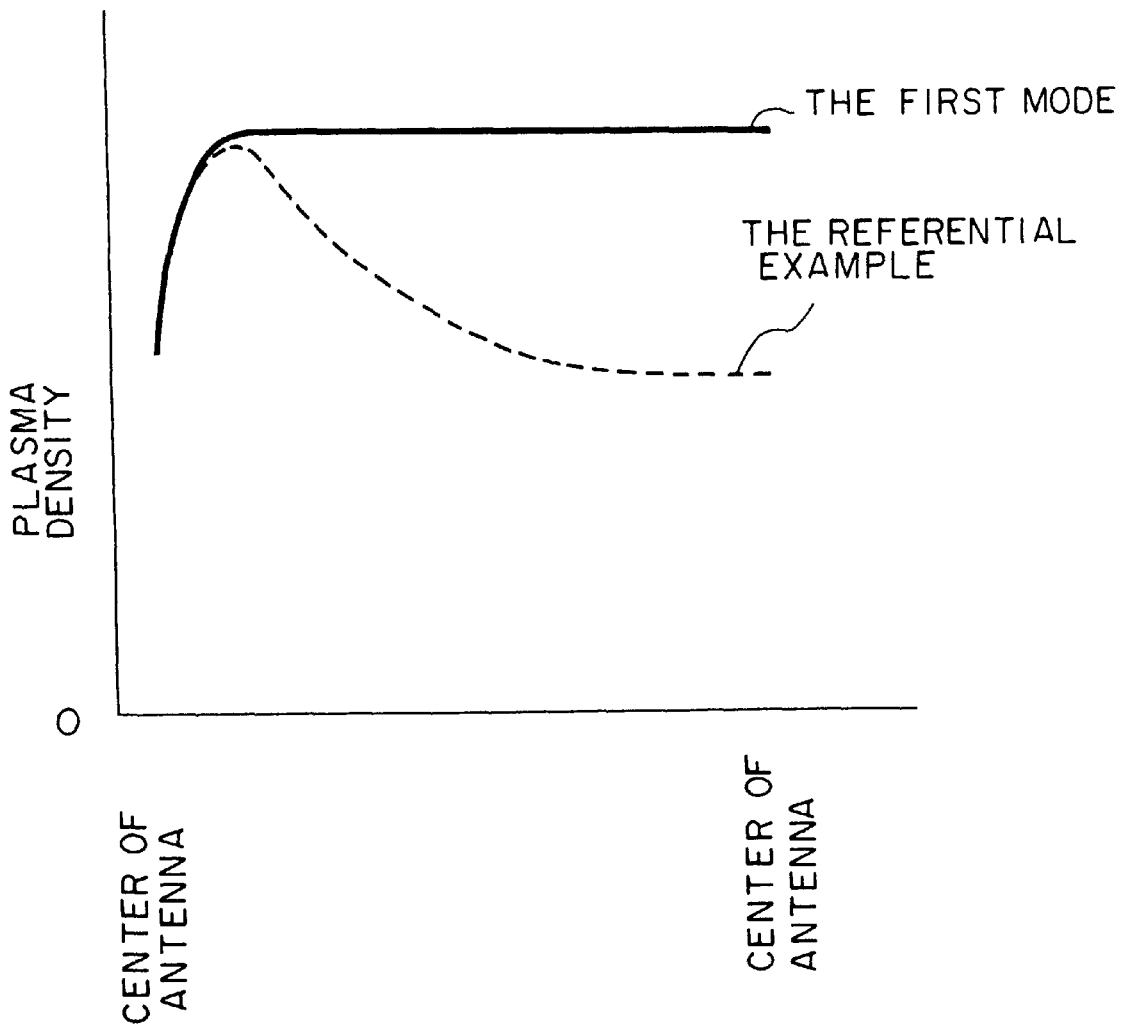
FIG. 5 shows a result of an experiment for confirming the effect of the first mode apparatus.

The apparatus of this mode having the described antenna 44 can generate a highly-uniform plasma with high efficiency on a plane parallel to the antenna plane. This point will be described. FIG. 5 shows a result of an experiment for confirming the effect of the apparatus of the first mode. This experiment was for measuring a plasma density profile on a plane (designated by "X—X" in FIG. 1) parallel to the antenna plane with the plasma generation space in vacuum chamber 1. The continuous line in FIG. 5 designates a plasma density profile in the apparatus of this mode. The dotted line in FIG. 5 designates a plasma density profile in an apparatus having the same composition as the first mode except that end shorting member 442 is omitted, which is called "referential example" in this specification. Input powers to antenna 44 are the same in both apparatuses.

As designated by the dotted line in FIG. 5, with the referential example, plasma density is prominently high at the region just beneath which the initially-excited antenna element 441 is located, and is much lower at other regions. This means that the supplied RF power is spent so much at the antenna element 441 with which RF line is connected and does not propagate to other antenna elements 441. Contrarily, as shown by the continuous line in FIG. 5, with the apparatus of this mode, plasma density is uniform at the plane parallel to the antenna plane. This means that the apparatus of this mode can generate a uniform plasma. In addition, the average of plasma density in this mode is higher than that in the referential example. This means that plasma generation efficiency is improved with the apparatus of this mode.

Figure 6:
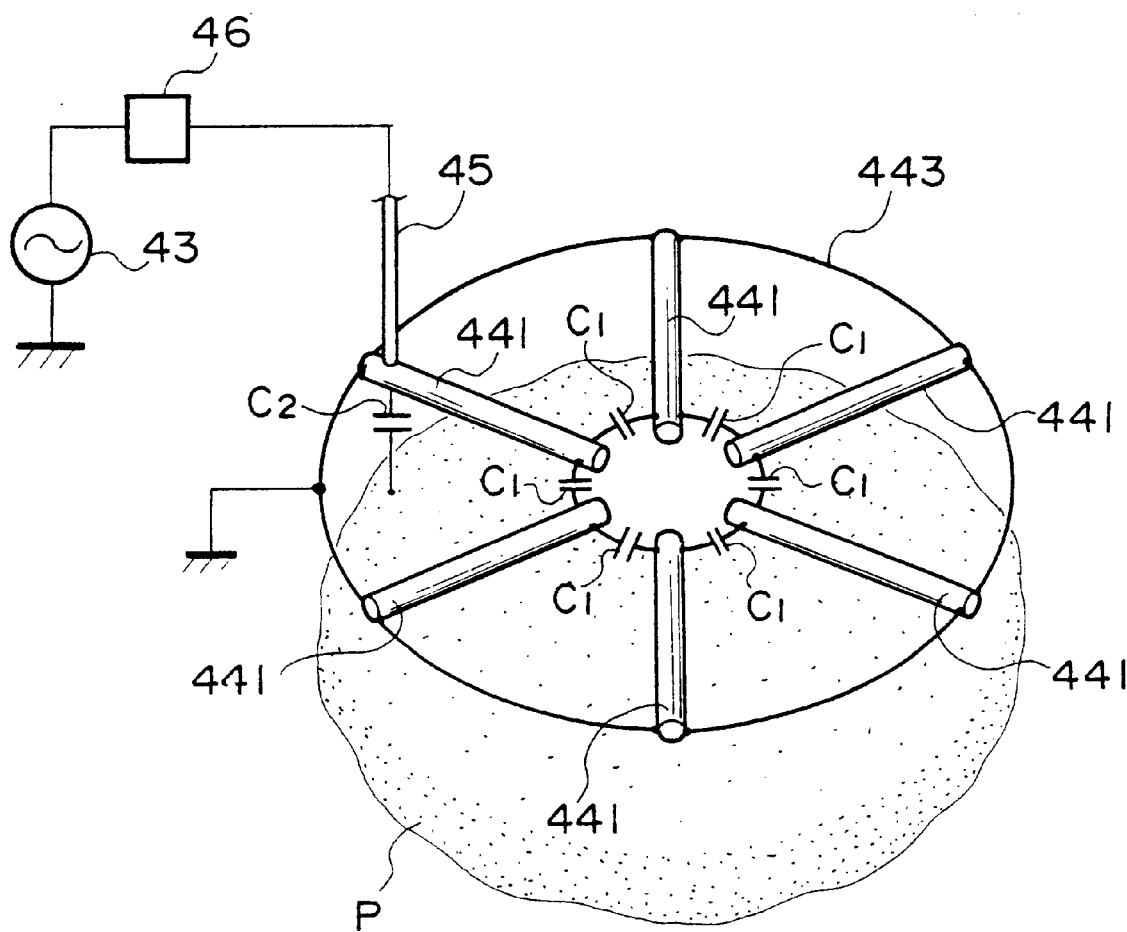
FIG. 6 is a schematic perspective view showing RF propagation situation with the referential example.

Though the mechanism that such a uniform and high-efficiency plasma is obtained has not been clarified completely, it is supposedly influenced by the following points. FIG. 6 is a schematic perspective view showing RF propagation situation with the referential example. If it is assumed that a resonance circuit is formed of neighboring two antenna elements 441 coupled with each other through space capacitance $C_1$ between inner ends of those two antenna elements 441. In other words, neighboring two antenna elements 441 and space capacitance $C_1$ supposedly form one resonant circuit. In this structure of the referential example, the couplings of every two neighboring antenna elements 441 are capacitive couplings through the space capacitance $C_1$. And, intensity of those couplings are much lower than the apparatus of the first mode where every two antenna elements 441 are directly coupled through end shorting member 442. When the initially-excited antenna element 441 is excited, in case end shorting member 442 is not provided the RF currents which flow at neighboring antenna elements 441 are much lower than in case end shorting member 442 is provided.

On the other hand, there is another space capacitance $C_2$ between each antenna element 441 and plasma "P" (shown in FIG. 1) generated by the electric field radiated from each antenna element 441. Each antenna element 441 and plasma "P" are capacitively coupled with each other. Specifically, an electric field having a component along a direction from plasma "P" to antenna elements 441. Electrons in plasma "P" are accelerated periodically by this electric field. The RF energy supplied with each antenna element 441 is given with electrons by the couplings through space capacitance $C_2$. As a result, the plasma "P" is generated and maintained.

In the referential example, it is assumed that much of RF energy is spent on the initially-excited antenna element 441, because the couplings with neighboring antenna elements 441 are weak. High proportion of supplied energy is spent on plasma "P" through the coupling of the initially-excited antenna element 441. In other words, because the couplings of neighboring antenna elements 441 are weak, the RF does not propagate to neighboring antenna elements 441 and is spent mostly on the plasma generation at the region just beneath the initially-excited antenna element 441. The prominence of plasma density shown by the dotted line in FIG. 5 is supposedly caused by the above described mechanism. And, if once the high-density region is formed, impedance of the region decreases, resulting in that the coupling with the region gets stronger to increase plasma density. This is just the same phenomenon as the starting of oscillation by a positive feedback. The initial non-uniformity of a plasma is amplified to localize the plasma more and more. Contrarily, in the apparatus of this mode, because end shorting member 442 reinforces the couplings of neighboring antenna elements 441, much more amount of the RF energy propagates to neighboring antenna elements 441, compared to amount of the RF energy spent at the region just beneath the initially-excited antenna element 441. As a result, the RF field applied from each antenna element 441 is uniform and balanced. Therefore, amounts of the RF energy spent at regions just beneath each antenna element 441 are also uniform and balanced. Such a mechanism as this supposedly brings the described uniform plasma As for the type of the RF coupling of antenna 44 and the plasma in the apparatus of this mode, because the RF current which flows at antenna elements 441 increases, it is assumed that not the capacitive coupling but the inductive coupling is major, compared to the referential example. Magnetic fields induced by the RF currents flowing at antenna elements 441 induce electric fields at the plasma generation space. There is supposedly high proportion that electrons receive the energy through acceleration by those induced electric fields. It should be noted that the inductive coupling can not be major completely without increasing the input power, because under the same input power the RF current does not increase so much even if end shorting member 442 is provided.

Next will be described the improvement of plasma generation efficiency. The inventors think the improvement of plasma generation efficiency is brought by following mechanism. Plasma generation efficiency is roughly defined as the ratio of average plasma density to total input energy. In the composition where the RF energy is supplied with the plasma via antenna 44, energy loss at antenna 44 decides the plasma generation efficiency if energy loss at RF line 45 is constant. First of all, the energy loss at antenna 44 is caused from that antenna elements 441 are not perfect conductor. This corresponds to the real number part of the impedance of antenna elements 441. As far as antenna elements 441 of the same material and the same surface state are used, this is not essentially improved. What is the most effective way to reduce the RF loss at antenna 44 is to form resonance circuits of antenna elements 441 as described. If the resonant condition is accomplished, the RF loss at antenna 44 gets minimum because the reactance gets minimum.

As known, when a plasma is generated by a gas discharge using electrodes, a plasma sheath is formed between the electrode and the plasma. The electric field of this sheath accelerates charged particles. In the apparatus of this mode and the referential example, a plasma sheath is formed at the boundary of the plasma and antenna 44. The described space capacitance $C_2$ includes the capacitance at the plasma sheath. Thickness of the plasma sheath is influenced by the plasma density. The plasma sheath gets thinner at a region where the plasma density is high and gets thicker at a region where the plasma density is low. When the plasma sheath gets thinner at a region, space capacitance $C_2$ increases because the space capacitance of the sheath increases. When the plasma sheath gets thicker at a region, space capacitance $C_2$ decreases because the space capacitance of the sheath decreases. In short, space capacitance $C_2$ gets out of uniform among antenna elements 441. Because space capacitance $C_2$ is included to the capacitive reactance of the line forming the described resonant circuit, non-uniformity of space capacitance $C_2$ brings deviation of the resonant frequency. In other words, the RF is resonant at a specific antenna element 441 but not resonant at other antenna elements 441. Otherwise, the RF is not resonant at all antenna elements 441. If the RF is not resonant, the RF loss increases because a standing wave is generated between antenna 44 and stub tuner 46, making displacement current flow between antenna 44 and stub tuner 46. As a result, the plasma generation efficiency decreases. In addition, the deviation of the resonant frequency brings another RF loss such as reflection of the RF because the RF couplings of every neighboring two antenna elements 441 is not sufficient.

Contrarily, in the apparatus of this mode, because a uniform-density plasma is generated, the space capacitance at the plasma sheath does not get out of uniform. Additionally, in the apparatus of this mode, there is high proportion that the plasma receives the RF energy through the inductive coupling. In the inductive coupling, because electrons are accelerated by the induced electric field having components along directions of antenna elements 441 to form the plasma, the plasma sheath does not get thinner at a region where the plasma density is low. Therefore, even if the plasma gets out of uniform from any reason, the resonant frequency is not affected by it. This is supposedly why the high-efficiency of the plasma generation is obtained.

Figure 7:
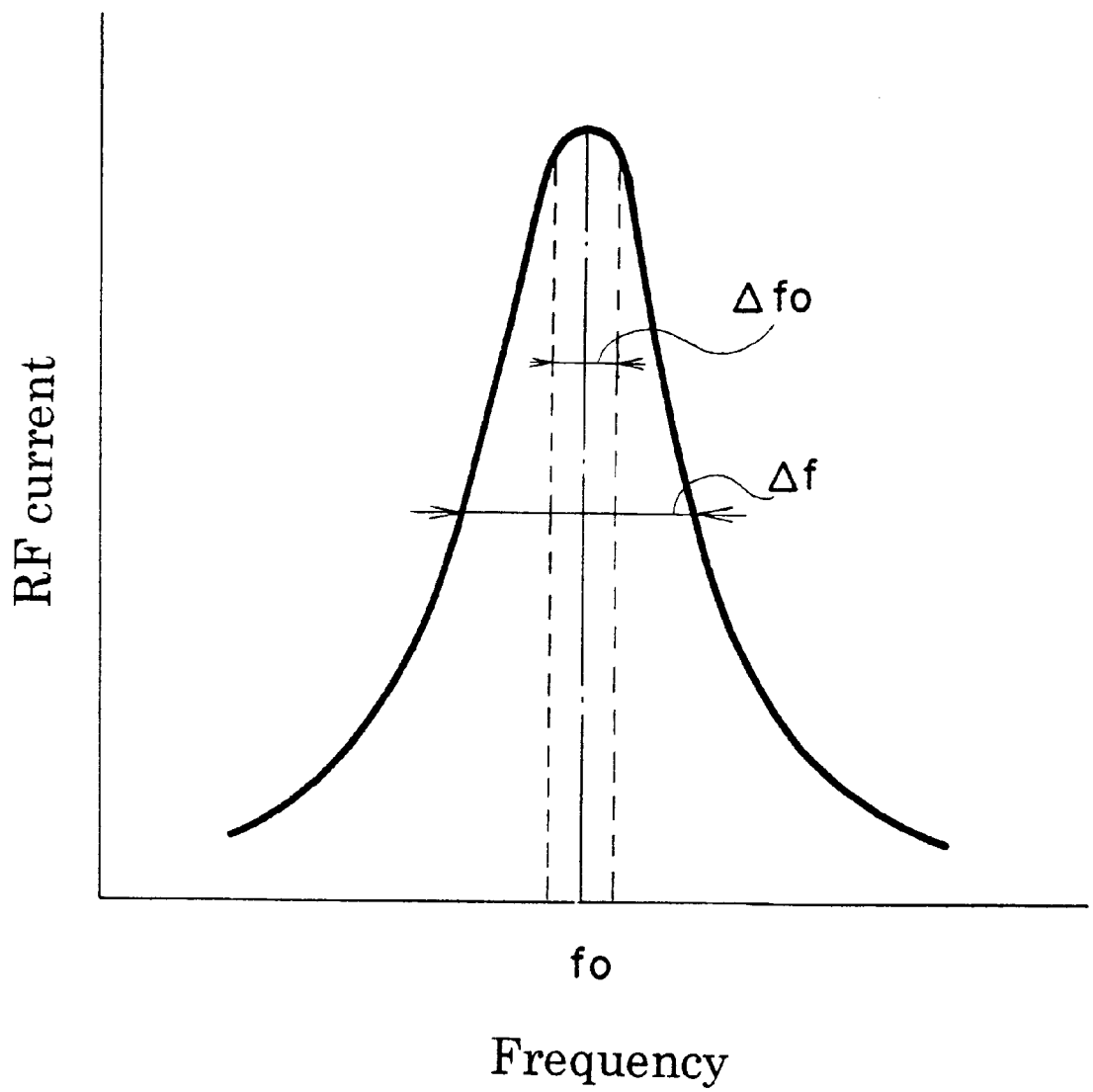
FIG. 7 explains intensity of the capacitive coupling of each antenna element and a plasma.

How much extent the capacitive couplings of each antenna element 441 and the plasma should be weakened can be described as follows. FIG. 7 explains the intensity of capacitive couplings of each antenna element 441 and a plasma. The extent of the capacitive couplings of each antenna element 441 and a plasma can be expressed as "as far as fluctuation of the plasma density does not affect the resonant frequency". As shown in FIG. 7, when the half band width of the resonant frequency is $\Delta f$ and the expected maximum width of deviation of the resonant frequency is $\Delta f_0$, the capacitive coupling should be weakened to the extent where a $\Delta f_0$ is small enough compared to $\Delta f$, i.e., $\Delta f >> \Delta f_0$.

Figure 8:
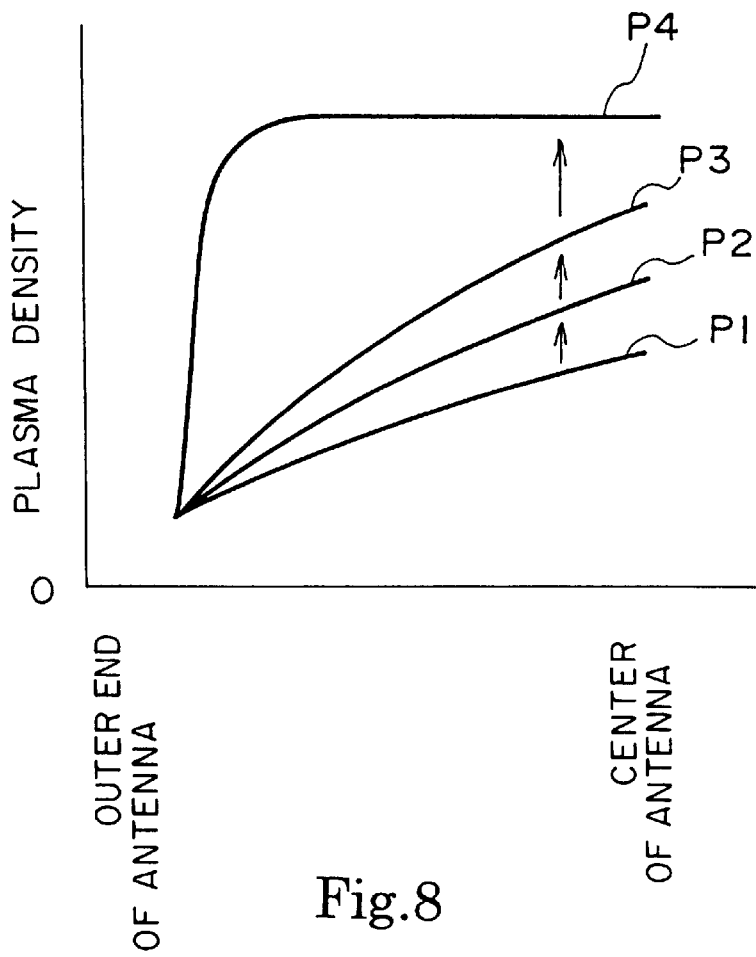
FIG. 8 explains about the inductive coupling and shows transformation of a plasma density profile when the input power is increased in the apparatus of FIG. 1.

As described, it is important to increase the input power to antenna 44 for higher proportion that antenna 44 and the plasma are inductively coupled with each other. This point will be described using FIG. 8. FIG. 8 explains about the inductive coupling and shows a transformation of plasma density profile when the input power is increased in the apparatus of FIG. 1. P1, P2, P3 and P4 in FIG. 8 all designate values of the RF power, where P1<P2<P3<P4. As shown in FIG. 8, where the RF power is low (P1, P2, P3), the plasma density is prominently high just beneath the inner end of antenna element 441 and comparatively low beneath the outer end of antenna element 441 with which holder 443 is fixed. As described, the voltage is maximum, i.e., the current is minimum, just beneath the inner end of antenna element 441, and the voltage is minimum, i.e. the current is maximum, beneath the outer end. Taking this into consideration, the plasma density profiles of P1, P2 and P3 shown in FIG. 8 mean that the capacitive coupling is major with antenna elements 441 and the plasma at those values of the RF power. Contrarily, when the RF power exceeds a critical value, as designated by P4, the plasma density beneath the outer end of antenna element 441 becomes as high as other region, that is, gets uniform. It can be said this result demonstrates the inductive coupling becomes major with antenna element 441 and the plasma, because the plasma density increases at the region close to the part of antenna element 441 where the RF current is high. Though theoretically the plasma density at the center region would be higher than the peripheral region, the plasma density at the peripheral region is reduced to be set off because of the loss of the plasma at the surface of holder 443 or vacuum chamber 1. If the pressure in vacuum chamber 1 is increased in addition to the RF power, the plasma density would become prominently high at the peripheral region.

The inductive coupling becomes enabled as a result that end shoring member shorting antenna elements 441 enables a high RF current to flow at antenna elements 441 by applying a high RF power. When the inductive coupling becomes major, a resonant frequency is not influenced by fluctuation of the plasma density. Therefore, the inductive coupling has a great practical advantage. Though the critical value of input RF power where the inductive coupling becomes major can not be given generally because it depends on such a factor as the pressure in vacuum chamber 1, expressing the power density where the input power to antenna 44 is divided by the cross section of holder 443 antenna 44, it is estimated that the inductive coupling would become major when the power density is more than 1 watt/cm$^2$.

As shown in FIG. 1, partition wall 5 is provided below antenna 44. Partition wall 5 isolates the space where antenna 44 is provided from the space where the plasma is generated. Partition wall 5 is made of dielectric such as quarts or alumina. Partition wall 5 is mounted air-tightly on the surface of holder 443. Partition wall 5 is provided so that the plasma can be generated only at the side where substrate 20 is placed in vacuum chamber 1. If partition wall 5 is not provided, the plasma generation gas would diffuse to the other side of antenna 44 to generate a plasma because antenna 44 also radiates the RF field to the other side. The plasma generated at the other side is just a waste of the RF energy because it is not utilized for a substrate processing. Moreover, with the composition of antenna 44 shown in FIG. 1, the space capacitance between antenna elements 441 and the upper wall of holder 443 affects a resonance frequency. If a plasma generated between antenna elements 441 and the upper wall of holder 443, the capacitance of this space fluctuates so much. As a result, the resonance frequency becomes very unstable. Therefore, partition wall 5 brings the much effect of suppression of the wasteful plasma generation and stabilization of the resonant frequency.

Whole operation of the apparatus of this mode will be described next. First of all, substrate 20 is place in a load-lock chamber connected air-tightly with vacuum chamber 1. After pumping the load-lock chamber and vacuum chamber 1 to about $10^{-6}$ Torr, a gate valve is opened and substrate 20 is loaded to vacuum chamber 1. Substrate 20 is placed on substrate holder 20. After shutting the gate valve, gas introduction means is operated to introduce a plasma generation gas into vacuum chamber 1. The flow rate of the plasma generation gas is controlled by gas flow controller 33. The introduced plasma generation gas diffuses in vacuum chamber 1 to reach the plasma generation space below antenna 44. After this, energy supply means 4 is operated to supply a RF power with antenna 44 from RF source 43 through RF line 45. The supplied RF power propagates antenna elements 441 uniformly as described, resulting in that a radiant and/or inductive electric field is applied uniformly at the plasma generation space. This electric field generates a plasma, which is utilized to carry out a process onto substrate 20. Specifically, as described, a plasma etching is carried out introducing a fluorine compound gas, or a amorphous silicon film deposition is carried out introducing a gas mixture of silane and hydrogen. After such a process is carried out, vacuum chamber 1 is pumped again. And, substrate 20 is unloaded from vacuum chamber 1. In the above operation, a uniform and high-efficiency process can be carried out because a uniform and high-density plasma is generated as described.

Figure 9:
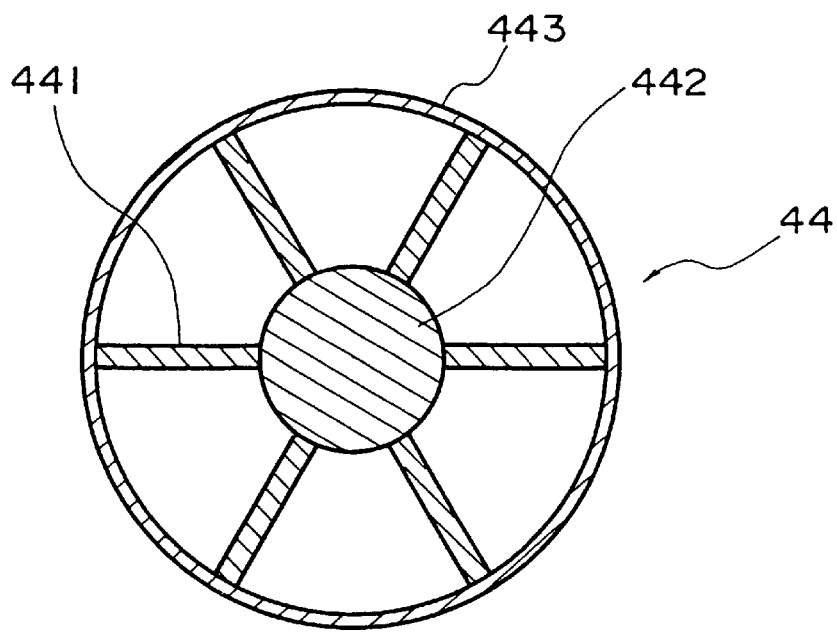
FIG. 9 is a schematic plane view of an antenna which is a main part of the second mode apparatus of the invention.

Other modes of the invention will be described next. FIG. 9 is a schematic plane view of an antenna which is a main part of the second mode apparatus of the invention. In the second mode, a round disk is used as end shorting member 442. Inner ends of each antenna element 441 are jointed with the edge of end shorting member 442. Thickness of end shorting member is the same as antenna elements 441 and material of end shorting member 442 is aluminum or copper as well the first mode. Also in the second mode, the effects of unification of the plasma density and improvement of the plasma generation efficiency are obtained because the couplings of every neighboring two antenna elements 441 are reinforced by end shorting member 442.

Figure 10:
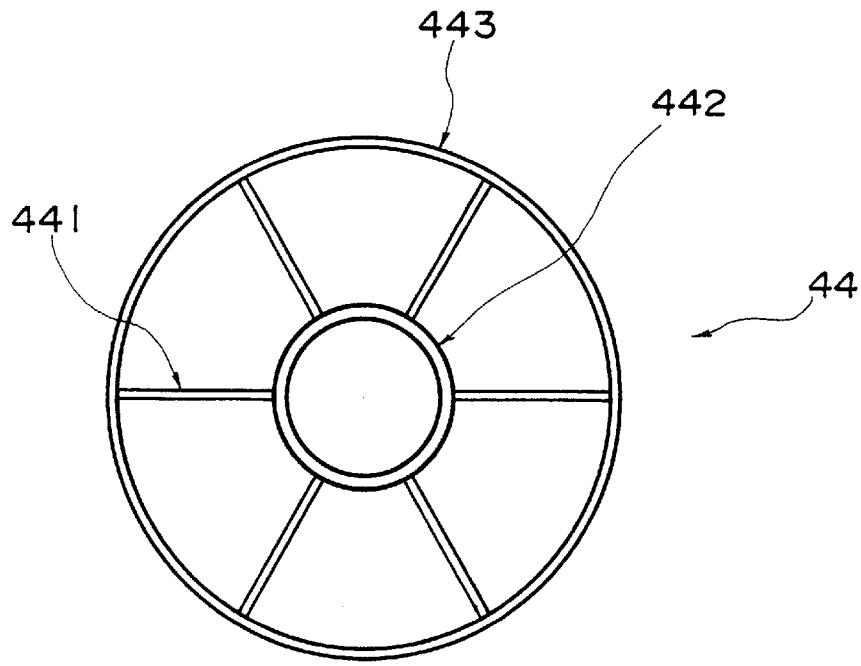
FIG. 10 is a schematic plane view of an antenna which is a main part of the third mode apparatus of the invention.

FIG. 10 is a schematic plane view of an antenna which is a main part of the third mode apparatus of the invention. In the third mode, a cylindrical member formed by rolling a metal belt is used as end shorting member 442. Width of the metal belt is the same as the section of antenna element 441. Material of end shorting member 442 is aluminum or copper as well. Also in the third mode, the effects of unification of plasma density and improvement of the plasma generation efficiency are obtained because couplings of every neighboring two antenna elements 441 are reinforced by end shorting member 442. In addition in the third mode, the area where end shorting member 442 faces to the plasma is smaller than the first and second mode. As a result of this, proportion of the capacitive coupling of end shorting member 442 and the plasma becomes more minor than the first or second mode. Therefore, the effects of the plasma density unification by reinforcing the coupling of neighboring two antenna elements 441 and the improvement of the plasma generation efficiency by stabilizing a resonant frequency are enhanced.

Figure 11:
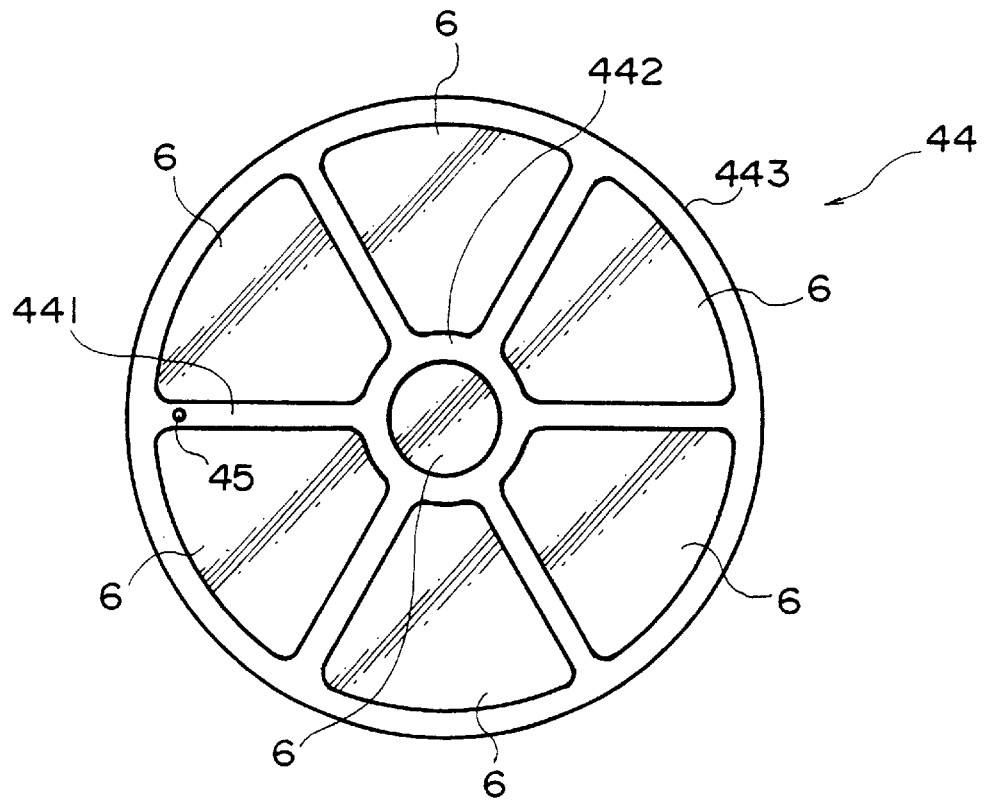
FIG. 11 is a schematic plane view of an antenna which is a main part of the forth mode apparatus of the invention.
Figure 12:
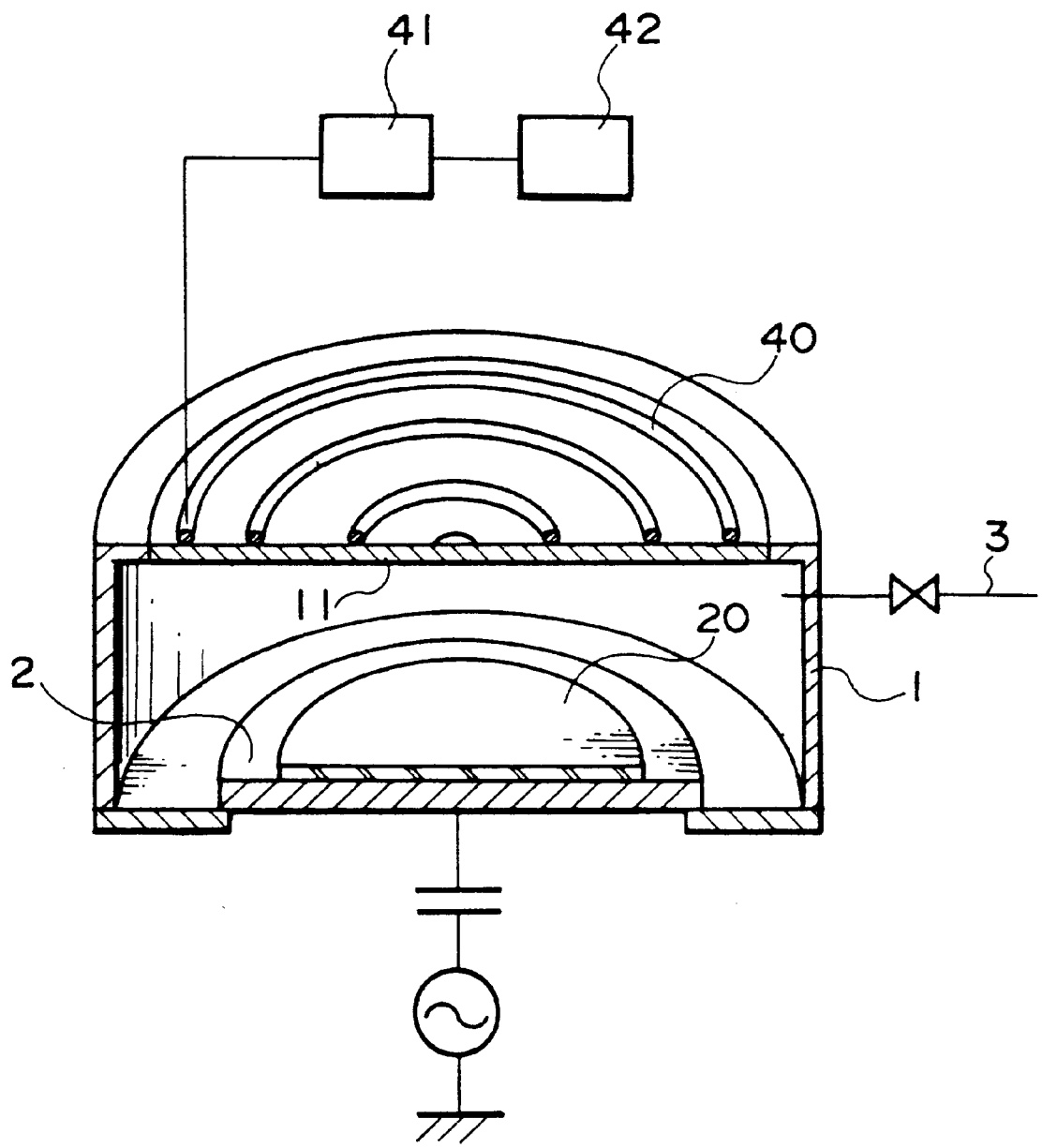
FIG. 12 shows an example of prior plasma processing apparatuses.

Furthermore, FIG. 11 is a schematic plane view of an antenna which is a main part of the fourth mode apparatus of the invention. Though the composition of antenna 44 in the fourth mode is the same as in the third mode, isolation blocks made of dielectric are provided. Openings formed of antenna elements 441 and end shorting member 442 are air-tightly filled with isolation blocks 6. Instead of this, the fourth mode apparatus does not have such partition wall 5 as in FIG. 1. Isolation blocks 6 perform the same function as partition wall 5. In the fourth mode, the distance between antenna elements 441 and the plasma can be shortened because partition wall 5 is not provided. As a result, the plasma generation efficiency can be enhanced furthermore. Specifically, intensity of the radiant electric field which is included in fields by antenna 44 characteristically decrease in inverse ratio to the distance. Therefore, the plasma generation efficiency can be improved by shortening the distance between antenna elements 441 and the plasma generation space for utilizing the region where the radiant field is high. Additionally, the dielectric loss at isolation blocks 6 is smaller than partition wall 5 in FIG. 1 because the total volume of isolation blocks 6 is smaller than the volume of partition wall 5. This also contributes to the improvement of the plasma generation efficiency.

The arrangement where antenna elements 441 are provided along radiate lines apart from each other with the same distance is one example of symmetric arrangements. There can be many other arrangements. For example, an arrangement where bar-shaped antenna elements are provided in parallel to each other with the same distance.

End shoring member 442 is also able to be modified to any symmetric form other than the described round ring or disk. For example, a ring or board formed into a regular polygon according to the number of antenna elements 441 can be used as end shorting member 442.

What is claimed is:

1. Plasma processing apparatus for carrying out a process onto a substrate utilizing a plasma generated by supplying RF energy with a plasma generation gas from an antenna, wherein said antenna has multiple antenna elements provided symmetrically to the center on the axis of said substrate and an end shorting member shorting said antenna elements at those ends further from RF supply points on said antenna elements so that an RF current path symmetrical to said center is applied interconnecting said ends of neighboring two of said antenna elements.

2. Plasma processing apparatus as claimed in claim 1, wherein multiple circuits resonant at a frequency of said RF energy are formed symmetrically of said antenna elements and said end shorting member.

3. Plasma processing apparatus as claimed in claim 2, wherein length obtained by adding total length of neighboring two of said antenna elements and length of said RF current path between said ends of said neighboring two of said antenna elements corresponds to one half of wavelength of said RF energy.

4. Plasma processing apparatus as claimed in claim 1, comprising a vacuum chamber having a pumping system, a substrate holder for placing a substrate to be processed in said vacuum chamber, a gas introduction means for introducing a plasma generation gas into a plasma generation space, a energy supply means for supplying RF energy with said plasma generation gas, wherein said energy supply means comprises said antenna.

5. Plasma processing apparatus as claimed in claim 1, wherein said antenna elements are provided at a plane parallel to said substrate, and a partition wall which isolates the space where said antenna elements are provided from the space where said plasma is generated is provided.

6. Plasma processing apparatus as claimed in claim 1, wherein said antenna elements are provided at a plane parallel to said substrate, and isolation blocks with which openings formed of said antenna elements and said end shorting member are filled up are provided.

7. Plasma processing apparatus as claimed in claim 1, wherein said antenna elements are bars with the same length provided along radiate lines symmetric to said center and displaced from said center with the same distance.

8. Plasma processing apparatus as claimed in claim 1, wherein frequency of said RF energy is in the range of 100 MHz to 1000 MHz.

9. Plasma processing apparatus as claimed in claim 4, wherein said energy supply means has a RF line to supply said RF energy with said antenna, and said RF line is connected with only one of said antenna elements.

* * * * *